United States Patent
Daems et al.

(10) Patent No.: US 6,759,175 B2
(45) Date of Patent: Jul. 6, 2004

(54) METHOD FOR ON-SITE PREPARATION OF A RELIEF IMAGE

(75) Inventors: Eddie Daems, Herentals (BE); Luc Leenders, Herentals (BE)

(73) Assignee: AGFA-Gevaert, Mortsel (BE)

( * ) Notice: Subject to any disclaimer, the term of this patent is extended or adjusted under 35 U.S.C. 154(b) by 0 days.

(21) Appl. No.: 09/832,660

(22) Filed: Apr. 11, 2001

(65) Prior Publication Data

US 2001/0038975 A1 Nov. 8, 2001

Related U.S. Application Data

(60) Provisional application No. 60/198,653, filed on Apr. 20, 2000.

(30) Foreign Application Priority Data

Apr. 11, 2000 (EP) .......................... 00201312

(51) Int. Cl.⁷ .............................. G03C 1/76; G03F 7/11
(52) U.S. Cl. .................. 430/199; 430/273.1; 430/311; 430/322; 101/128; 101/129
(58) Field of Search .............................. 430/199, 311, 430/273, 200, 201, 204, 253, 258, 259, 302, 273.1; 101/128

(56) References Cited

U.S. PATENT DOCUMENTS

| | | | |
|---|---|---|---|
| 4,515,877 A | | 5/1985 | Barzynski et al. |
| 4,555,471 A | * | 11/1985 | Barzynski et al. ........ 430/270.1 |
| 5,015,553 A | * | 5/1991 | Grandmont et al. ........ 430/260 |
| 5,262,275 A | * | 11/1993 | Fan .......................... 430/271.1 |
| 5,888,712 A | * | 3/1999 | Lelental et al. ............. 430/527 |
| 6,085,655 A | * | 7/2000 | Harris et al. ................. 101/456 |
| 6,143,470 A | * | 11/2000 | Nguyen et al. ........... 430/273.1 |
| 6,190,832 B1 | | 2/2001 | Goffing et al. |
| 6,367,381 B1 | * | 4/2002 | Kanga ....................... 101/295 |

FOREIGN PATENT DOCUMENTS

| | | |
|---|---|---|
| EP | 0001138 A | 3/1979 |
| WO | WO 94/03838 | 2/1994 |
| WO | WO 97/00777 | 1/1997 |
| WO | WO 97/20252 | 6/1997 |

OTHER PUBLICATIONS

Partial European Search Report, Application No. EP 00201312, Sep. 18, 2000.

* cited by examiner

*Primary Examiner*—Mark F. Huff
*Assistant Examiner*—Kripa Sagar
(74) *Attorney, Agent, or Firm*—Leydig, Voit & Mayer, Ltd.

(57) ABSTRACT

An method is disclosed for on-site preparation of a relief image comprising the following steps:

(a) laminating a material comprising, in the order given, a first peelable support (1), an image recording layer (2) and an adhesive layer (3) onto a UV-sensitive material comprising a support (7), an UV-sensitive layer (6) wherein the adhesive layer (3) is laminated to the UV-sensitive layer (6);

(b) image-wise exposing the image recording layer (2) to form a mask;

(c) flood exposing the UV-sensitive material through the mask;

(d) developing the UV-sensitive material;

wherein the peelable support (1) is removed either before step (b), (c) or (d). Steps (a) to (d) are performed within a period of less than 2 months. As a result the extent of monomer diffusion from the UV-sensitive layer to the image recording layer is reduced. Additionally the adhesion between the image recording layer and the UV-sensitive material is optimised. Furthermore, almost all conventional imaging materials, that are normally used for contact exposure, can be applied in this method.

19 Claims, 1 Drawing Sheet

METHOD FOR ON-SITE PREPARATION OF A RELIEF IMAGE

This application claims the benefit of U.S. provisional patent application No. 60/198,653, filed Apr. 20, 2000.

FIELD OF THE INVENTION

The present invention relates to a method for the preparation of a relief image, more specifically for the preparation of a photoresist image, a lithographic printing plate precursor or a flexographic printing plate precursor.

BACKGROUND OF THE INVENTION

Relief images such as resist images or printing plates are generally produced using positive-working or negative-working UV-sensitive materials that are exposed to UV-radiation. The exposed (positive-working) or unexposed (negative-working) areas of UV-sensitive layer are then removed, generally by wash-out with a developing solution, to form the relief image. During the UV exposure, conventionally, a film carrying a negative or positive image is used as a contact mask. In computer-to-plate or computer-to-film technology, the conventional contact mask can be replaced by a mask which is formed by image-wise exposing a recording layer which is integrated within the material. Such an integrated mask can be provided by printing with an ink jet printer on an ink receiving layer or by heat-mode exposure of an ablatable imaging layer which is substantially opaque to UV radiation.

U.S. Pat. No. 4,555,471 describes a multilayer image recording material that is formed by applying a resist film comprising an intermediate layer, a mask-forming heat-sensitive layer and optionally a top layer onto the relief forming layer of a recording material.

In WO-A-94 03838 and WO-A-94 03839 a process for making flexographic printing plates is disclosed comprising the construction of two separate elements that are laminated to form a printing plate. The first element is a conventional photopolymerizable element, the second element comprises an IR-sensitive layer and a removable coversheet. A barrier layer can be present either on the photopolymerizable layer or on the IR-sensitive layer. The elements are laminated such that the IR-sensitive layer is interposed between the photopolymerizable layer and the cover sheet or that the barrier layer is interposed between the photopolymerizable layer and the IR-sensitive layer. The barrier layer can include polyamides, polyvinyl alcohols, hydroxyalkyl celluloses, vinyl acetate copolymers or polyesters and is present as an oxygen barrier layer and to avoid monomer diffusion from the photopolymerizable layer into the IR-sensitive layer. In EP-A-741 330 no barrier layer is present and the IR-sensitive layer is laminated directly onto the photopolymerizable layer. The coversheet can be subbed with release layers and has to be removed before image-wise exposure.

WO-A-97 00777 discloses a printing plate that is formed by lamination of two elements A and B. Element A is a support with a photopolymerizable layer. Element B comprises a support that is coated on one side with a laser ablatable layer and on the other side with an adhesive layer. Element B is laminated with the adhesive bearing side onto element A so that the laser ablatable layer becomes the top layer and the support of B is located between the ablatable layer and the photopolymerizable layer. UV-exposure of the photopolymerizable layer through the mask formed in the IR-sensitive layer results in unsharp images due to the thick support which is present between the IR-sensitive layer and the photopolymerizable layer.

In EP-A-767 408 a flexographic printing plate is described that is prepared by laminating an IR-sensitive layer covered by a peelable protective film onto a photopolymerizable element comprising a support, optionally an adhesive layer, a photopolymerizable layer, an interlayer and optionally a release layer. Before image-wise exposure the protective film and optionally the release layer are removed.

Contrary to the material of WO-A-97 00777, no support is present between the photopolymerizable layer and the IR-sensitive layer. However, the lamination step of the material disclosed in EP-A-767 408 is performed by the plate manufacturer, so there is a large time lapse between the lamination and the actual making of the relief image by the end-user. After the lamination, the relief imaging material is packed, shipped to the traders (warehouses), stored and finally transported to the end-user. This process of transporting the relief imaging material from the manufacturer to the end-user takes at least three to four months. Furthermore, generally there is also a (varying) time lapse between the arrival of the relief imaging material at the end-user and the actual use of the material. During this entire period, monomer diffusion from the UV-sensitive photopolymerizable layer into the image recording layer can occur. To slow down this diffusion process EP-A-767 408 provides the solution of introducing an interlayer between the image recording layer and the photopolymerizable layer. However, since this interlayer is optimised to prevent monomer diffusion it does not adhere optimally to the image recording layer. Moreover, the known adhesion layers have poor barrier properties, so it is difficult to find a suitable compromise between good barrier functionality and sufficient adhesion.

In addition, the integrated materials (for use in computer-to-plate or computer-to-resist technology) are still significantly more expensive than the conventional materials for contact exposure.

SUMMARY OF THE INVENTION

It is a first object of the present invention to provide an inexpensive method for the preparation of a relief image by direct exposure of an integrated mask.

It is a further object of the present invention to provide such a method wherein the adhesion between the image recording layer and the UV-sensitive material is improved and wherein the extent of monomer diffusion from the UV-sensitive layer to the image recording layer is reduced.

The above mentioned objects are realised by a method having the specific features defined in claim 1.

The diffusion of monomers is avoided because the lamination is carried out by the end-user, just before the preparation of the relief image, thereby reducing the time period during which the UV-sensitive layer and the image recording layer are in mutual contact. As a consequence the interlayer does not need to have good barrier properties and can be optimised to adhere optimally to the image recording layer. Additionally, the present invention enables the use of conventional UV-sensitive materials, commonly applied for contact-exposure, which are less expensive then the imaging materials available for computer-to-plate or computer-to-resist technology.

Another advantage of the present invention is the increased resolution of the obtained relief image because of the absence of a thick layer (support) between the image recording layer (2) and the UV-sensitive layer (6).

Further advantages and embodiments of the present invention will become apparent from the following description and drawing.

DETAILED DESCRIPTION OF THE INVENTION

Figure 1:
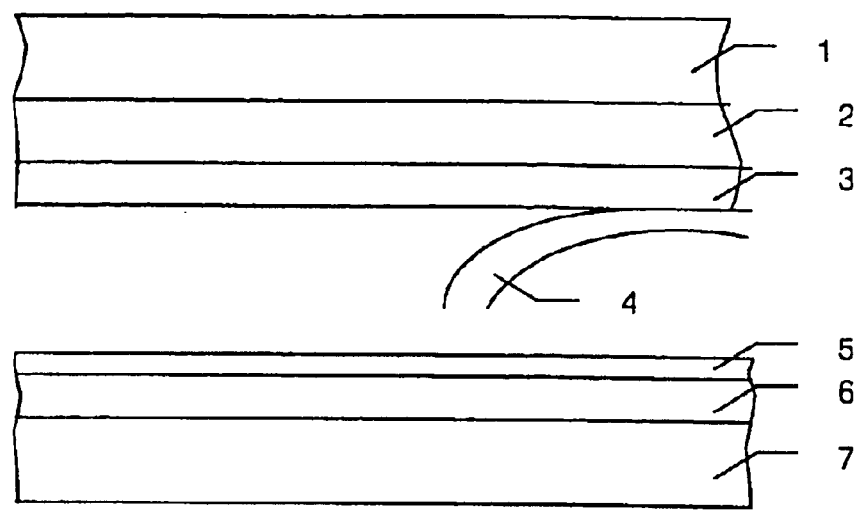
FIG. 1 shows a preferred embodiment of the present invention.

According to the present invention a method for on-site preparation of a relief image is provided. The feature 'relief image' shall be understood as to comprise images formed in UV-sensitive materials such as photoresist imaging materials, flexographic printing plate precursors as well as lithographic printing plate precursors (although the relief formed in the latter is only a few $\mu$m). Photoresist imaging materials include the positive or negative working UV-sensitive materials that are used to produce printed circuit boards, integrated circuits, printing plates or that are used for structuring electroconductive layers. Flexographic printing plate precursors typically contain a photopolymerizable layer comprising an elastomeric binder, a monomer and a photoinitiator on a flexible support. Lithographic printing plate precursors comprise a support having a hydrophilic surface covered by a UV-sensitive layer. In this layer a 'micro-relief' of hydrophilic and hydrophobic areas is formed upon image-wise exposure.

'On site preparation' shall be understood as the performance by the end-user of the whole process of laminating, image-wise exposing, flood exposing and developing. According to the method of the present invention this process is completed within a time period of less than two months. Preferably this process is completed within less than one month and most preferably this process is completed within one to three days.

According to a step of the method of the present invention, a material comprising a first peelable support (1), an image recording layer (2) and an adhesive layer (3) is provided that is laminated onto a UV-sensitive material comprising a support (7) an UV-sensitive layer (6) and optionally a protective layer (5) (e.g. as depicted in a preferred embodiment in FIG. 1.

As a first peelable support (1) any conventional plastic film support that is releasable from the image recording layer (2) can be used. Examples of suitable supports include polymeric films of polyethylene terephtalate, cellulose triacetate, polypropylene, polyethylene and resin coated paper. Also supports that have been coated with a release layer of for example polyethylene wax, carnauba wax, cellulose polymers, tetrafluoroethylene telomers, organosilicates, polymethylmethacrylate, polyvinylpyrolidone, polyamides, polyacrylamide or halogenated rubbers can be used. Preferably a polyethylene terephtalate film coated with a silicone release layer is used.

As an image recording layer (2) according to the present invention a laser imeageable layer, an ink jet receiving layer, a thermographic or photothermographic recordable layer can be used.

The image recording layer (2) according to the present invention is preferably a laser imageable layer. In a highly preferred embodiment of the invention the image recording layer (2) is a laser ablatable layer. The laser ablatable layer preferably comprises a heat combustible polymeric binder and a light absorbing compound. The heat-combustible polymeric binder can be decomposed, depolymerized or evaporated without a preceding melting step by the heat generated by the absorbing compound upon laser exposure. Preferably the heat-combustible polymeric binder comprises nitro groups or nitrate ester groups. Especially nitrate esters of cellulose or cellulose ethers are preferred. More specifically nitro-cellulose is used. The preferred light absorbing compounds are IR-absorbing dyes such as phthalocyanines or derivatives, cyanine dyes, merocyanine dyes and polymethine dyes or inorganic pigments such as carbon black, graphite, iron oxide or chromium oxide. Preferably carbon black is used. Furthermore carbon black renders the ablatable layer opaque to UV radiation, so there is no need to add an additional UV-absorbing dye. It is particularly preferred to use fine-grained carbon black with a mean particle size below 30 nm which is commercially available as Printex® U, Printex® L6, Specialschwarz 4 or Specialschwarz 250 (all trademarks from Degussa).

Ink jet receiving layers as described in EP-A-701 902, EP-A-609 930 or EP 00 200 600 can be used according to the present invention.

As a thermographic recordable layer according to the present invention a layer comprising a binder, an organic silver salt, a reducing agent and a antihalation dye can be used. The photothermographic recordable layer usable according to the present invention additionally comprises a photosensitive silver halide. Suitable (photo)thermographic layers are described in EP-A-810 467.

In another preferred embodiment of the invention the image recording layer (2) is a thin metallic layer. Laser exposure of this metallic layer causes ablation of the exposed areas by melting or evaporating the exposed areas, contracting upon melting by surface tension whereby small cavitations or holes are formed through which UV-light can pass and the density is lowered to a certain $D_{min}$ value depending on the laser energy irradiated. Possible metals for this image recording layer (2) include Mg, Sc, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Sn, As, Sb, Bi, Se, Te. These metals can be used alone or as a mixture or alloy of at least two metals thereof. Due to their low melting point Mg, Zn, In, Sn, Bi and Te are preferred. Most preferred is Bi. Also metal oxides, metal chalcogenides, alloys of at least two metals, and mixtures of these different species can be used. The metallic image recording layer may be applied by vapour deposition, sputtering, ion plating, chemical vapour deposition, electrolytic plating, or electroless plating. In the preferred case of Bi the recording layer is preferably provided by vapour deposition in vacuo as disclosed in EP-A-384 041.

On top of the image recording layer (2) an adhesive layer (3) is provided. Preferably the adhesive layer is a thermosensitive adhesive layer or a pressure-sensitive adhesive layer. Thermosensitive adhesives can be used at room temperature up to 110° C. Suitable thermosensitive adhesives are selected from the group of vinylacetate copolymers, acrylate copolymers and alkylacrylate copolmers. Pressure-sensitive adhesives are usually composed of thermoplastic polymers that have some elasticity at room temperature which is controlled optionally with a plasticizer and/or tackifying resin. Particularly suitable pressure-sensitive adhesives are selected from the group of polyterpene resins, acrylate copolymers, polyvinylmethyl-ether, copolymers of styrene-butadiene and vinylacetate modified acrylate copolymers being tacky at 20° C.

Since the pressure-sensitive adhesive layer (3) is tacky at room temperature it is preferably covered with a second peelable support (4) (to avoid sticking). The second peelable support (4) is a plastic film coated with a release agent. Preferably a polyester film and more preferably a polyethylene terephtalate film is used. Silicone is preferably used as a release agent.

The above described material can be prepared in several ways. For example, the image recording layer is coated onto the first peelable support (1) and then a thermosensitive adhesive is applied theron. In case a pressure-sensitive adhesive layer (3) is used the pressure-sensitive adhesive can first be coated onto the second peelable support (4) and then be laminated onto the image recording layer (2) that has been coated onto the first peelable support (1). Also, the first peelable support (1) can be coated with the image recording layer (2) onto which the pressure-sensitive adhesive is coated. Hereafter the second peelable support (4) may be laminated onto the pressure-sensitive adhesive layer (3). In the above described cases it is advantageous that the adhesion of the second peelable support (4) to the pressure-sensitive adhesive layer (3) is lower then the adhesion of the first support (1) to the image-recording layer (2).

The above described material is laminated onto a UV-sensitive material so as to make a UV-sensitive material provided with an integrated masking layer. According to the present invention, this UV-sensitive material can be a positive or negative working photoresist material or a UV-sensitive printing plate precursor. Preferably, the UV-sensitive material is a flexographic printing plate precursor comprising on a support (7) a UV-sensitive layer (6) and optionally a protective layer (5). This protective layer (5) is a thin layer transparent to UV-light that limits oxygen diffusion. This layer is usually made of polyvinylalcohol or polyamide.

According to the method of the invention, if present, the second peelable support (4) is removed from the material described above. Subsequently, the material is laminated with the adhesive layer onto the UV-sensitive layer (6) or protective layer (5). Before image-wise exposing the image recording layer (2), the first peelable support (1) can be removed. Thereafter the material is image-wise irradiated. Preferred devices used for image-wise exposure are Nd/YAG lasers (1064 nm) or diode lasers (e.g. 830 nm).

After the image-wise exposure the material is subjected to flood exposure with UV-light through the mask. This causes the areas of the UV-sensitive layer (6) which are not covered by the image recording layer (2) to become insoluble in a developer (negative working UV-sensitive materials, e.g. by photopolymerization or photocrosslinking) or to solubilise (positive working UV-sensitive materials). Suitable sources for the flood exposure include carbon arcs, mercury-vapour arcs, fluorescent lamps, flash units and photographic flood lamps. Alternatively, the first peelable support (1) is not removed before image-wise exposing the image recording layer (2). It can be removed after the image-wise exposure or after flood exposure.

After the flood exposure, the UV-irradiated material is developed. As a developer aqueous or organic solvents or solvent mixtures can be used. Suitable developer solutions can dissolve the exposed or non-exposed areas of the UV-sensitive layer (6) as well as the mask in one developing step.

Alternatively, an additional step can be performed between the flood exposure and development to remove the mask. The mask can be developed in a suitable developer or can be peeled off. The latter is especially performed when the image recording layer (2) is a thin metallic layer. Following development the relief image is dried.

In a preferred method of the present invention a flexographic printing plate precursor is used as UV-sensitive material. After lamination and optional removal of the first peelable support (1) the material may preferably be mounted on a rotatable cylindrical drum and image-wise exposed.

In case the image recording layer (2) is a thin metallic layer, it is preferred to first mount the UV-sensitive material on a rotatable cylindrical drum before laminating the imaging material thereto. After image-wise exposure and subsequent flood exposure through the mask, the imaging layer and first peelable support can be removed from the UV-sensitive material.

After image-wise exposure the printing plate precursor is removed from the drum and developed. Suitable developers are Perkanol (C K Chemicals), tetrachloroethylene/butanol and preferably Nylosolv II® (available from BASF). Following development the relief image is dried, typically during 1–4 h at 45° C.–65° C. In addition, several post-development treatments may be applied such as exposure to radiation having a wavelength not higher than 300 nm or treatment with bromine or chlorine solutions to detackify the printing plate. The method for making a flexographic printing plate may additiionally include a backside exposure i.e. a blanket exposure to actinic radiation through the support (7). It is used to create a shallow layer of photopolymerized material (a floor) on the support side of the photopolymerizable layer. This floor provides an improved adhesion between the photopolymerizable layer and the support (7), helps to improve resolution and establishes the depth of the plate relief. The backside exposure can be performed before, during or after the imaging step. Preferably the backside exposure is carried out just before the imagewise exposure. Any of the above discussed conventional radiation sources can be used for the backside exposure.

EXAMPLES

While the present invention will hereinafter be described in connection with preferred embodiments thereof, it will be understood that it is not intended to limit the invention to those embodiments.

Example 1

Preparation of the Imaging Material

An image recording composition was prepared from a coating solution containing the following ingredients dispersed in 27 g MEK/ethylacetaat (1:1 v/v):

| Component | Amount (g) | Function |
| --- | --- | --- |
| Special schwarz 250 (Degussa) | 1.02 | Carbon black pigment |
| Nitrocellulose (Wolff Walsroder NC type E950) | 1.54 | Heat combustible polymer |
| Solsperse 28000 (Zeneca Resins) | 0.10 | Dispersion agent |
| Solsperse 5000 (Zeneca Resins) | 0.02 | Dispersion agent |
| Plasthall 4141 (CP Hall Company) | 0.32 | Plasticizer |
| Baysilon MA (Bayer) | 0.027 | Coating aid |

This solution was coated onto a Lumirror X43 film (125 µm PET film from Torray) as a first peelable support by means of a 30 µm coating knife and dried for 2 min. at 45° C. yielding an image recording layer with a dry coating weight of 3 g/m$^2$ having an optical density in the UV region of 3.5.

Onto this image recording layer an adhesive layer was coated from a solution containing the following ingredients: 5.26 g Primal N560J (57% acrylate based dispersion in water from Rohm & Haas), 14.5 g destilled water and 0.2 g of a 5% solution of perfluorcaprilamidpolyglycol in water.

This solution was applied with a 20 μm coating knife and dried for 3 min. at 45° C. in a fan oven.

Lamination

First the cover film was peeled off from a Nyloflex FAH114 (available from BASF) flexographic printing plate precursor. The UV-sensitive layer of the flexographic printing plate precursor was then contacted with the adhesive layer of the imaging material and laminated in a Codor Lamipacker LPP650 at room temperature.

Image-Wise Exposure (Preparation of the Mask)

After removal of the first peelable support, the flexographic printing plate precursor was image-wise exposed with a NdYLF laser (1064 nm) having a spot size of 18 μm, a pitch of 10 μm and a scan speed of 2 m/s. The image plane power was set between 200 and 450 mW with intervals of 50 mW.

Preparation of the Flexographic Printing Plate

After image-wise exposure the flexographic printing plate precursor was flood exposed through the mask with UV radiation (4000 μW/cm$^2$) for 15 min. followed by an exposure through the opposite site for 10 min. Thereafter the flexographic printing plate precursor was developed in a drum brush washer using the commercially available developing solution Nylosolv II® (available from BASF). After development the flexographic printing plate was dried for 2 h. at 600, irradiated with UV-C to detackify and postexposed with UV radiation for 10 min. Table 1 lists density values of the image obtained in the mask after image-wise exposure Table 1: Net Optical Density of the Image-Wise Exposed Mask The maximum density $D_{max}$ (net), and minimum density $D_{min}$ (net), of the mask were measured through a UV-filter with a MacBeth TR904 densitimeter in the grey scale step corresponding to data levels of 255 and 0 respectively.

| Laser power (mW) | $D_{uv}$-max | $D_{uv}$-min |
|---|---|---|
| 200 | 3.50 | 1.65 |
| 250 | 3.50 | 0.48 |
| 300 | 3.50 | 0.32 |
| 350 | 3.50 | 0.20 |
| 400 | 3.50 | 0.15 |
| 450 | 3.50 | 0.12 |

The flexographic printing plate thus obtained was mounted on a printing press and produced excellent prints.

Example 2

Preparation of the Imaging Material a. Adhesive Layer

Onto a Persalic-L-36 film (36 μm PET film from Perlen Converting coated on one side with a silicone release agent) an adhesive layer was coated from a solution containing 131 g Duro-Tak 380-1846 (National Starch & Chemicals) and 69 g destilled water. This solution was applied with a 20 μm coating knife and dried for 2 min. at 45° C. in a fan oven.

b. Image Recording Layer

On a 50 μm PET support coated with a subbing layer a 300 nm bismuth layer was deposited in vacuo (10$^{-3}$ bar) with a Leybold-Hereaus type 1140 vacuum depositor.

c. Imaging Material

The adhesive layer was laminated onto the bismuth layer of the image recording material with a Codor Lamipacker LPP 650 at room temperature.

Lamination

A Nyloflex FAH114 (available from BASF) flexographic printing plate precursor was mounted on the drum (Ø 20 cm) of an external drum NdYLF laser recorder after the cover film was peeled off. The second peelable support of the imaging material was removed and the adhesive side of the imaging material was manually laminated with a Kaiser Rollenquetscher 4056 onto the flexographic printing plate precursor.

Image-Wise Exposure (Preparation of the Mask)

The flexographic printing plate precursor was image-wise exposed with a NdYLF laser (1064 nm) having a spot size of 18 μm, a pitch of 10 μm and a scan speed of 4 m/s. The image plane power was set between 200 and 450 mW with intervals of 50 mW.

Preparation of the Flexographic Printing Plate

After image-wise exposure the flexographic printing plate precursor was flood exposed through the mask with UV radiation (4000 μW/cm$^2$) for 15 min. Thereafter the mask was removed by peeling the first peelable support from the flexographic printing plate precursor. Then the flexographic printing plate precursor was removed from the drum and exposed through the opposite site for 10 min. Subsequently the flexographic printing plate precursor was developed in a drum brush washer using the commercially available developing solution Nylosolv II® (available from BASF). After development the flexographic printing plate was dried for 2 h. at 600, irradiated with UV-C to detackify and postexposed with UV radiation for 10 min. Table 2 lists density values of the image obtained in the mask after image-wise exposure.

TABLE 2

| Net optical density of the image-wise exposed mask | | |
|---|---|---|
| Laser power (mW) | $D_{uv}$-max | $D_{uv}$-min |
| 200 | 3.35 | 0.68 |
| 250 | 3.35 | 0.38 |
| 300 | 3.35 | 0.31 |
| 350 | 3.35 | 0.27 |
| 400 | 3.35 | 0.22 |
| 450 | 3.35 | 0.21 |

The flexographic printing plate thus obtained was mounted on a printing press and produced excellent prints.

Example 3

Preparation of the Imaging Material

Onto a Lumirror X43 film (125 μm PET film from Torray) the following ink jet receiving layer was coated at a wet coating thickness of 100 μm and dried:

| Component | Amount |
|---|---|
| Gelatin (Koepff t16096) | 160 g |
| Water | 2013 ml |
| Akypo OP-80 (4.7% solution in water from Chemy) | 20 ml |
| Perfluoro octanoic acid $NH_4$-salt (5% solution in water) | 2 ml |

Onto the dried ink jet receiving layer an adhesive layer was coated from a solution containing the following ingredients: 1132 g Permutex PS-34-211 (pressure sensitive adhesive from Stahl Holland b.v.), 790 ml water and FT248 (5% solution in water/ethanol from Bayer). This solution was applied with a 10 μm coating knife and dried for 4 min. at 45° C. in a fan oven.

Lamination

First the cover film was peeled off from a Nyloflex FAR284 (available from BASF) flexographic printing plate precursor. The UV-sensitve layer of the flexographic printing plate precursor was then contacted with the adhesive layer of the imaging material and laminated in a Codor Lamipacker LPP650 at room temperature.

Ink Jet Printing

After removal of the first peelable support the printing plate precursor was provided with an image by jetting information-wise a water based black ink onto the ink jet receiving layer in a HP890C ink jet printer. A $D_{max}$ (UV) value between 3.9 and 4.25 was obtained in the printed areas.

Preparation of the Flexographic Printing Plate

After image-wise exposure the flexographic printing plate precursor was flood exposed through the mask with UV radiation (4000 $\mu$W/cm$^2$) for 15 min. followed by an exposure through the opposite site for 10 min. Thereafter the ink jet receiving layer was removed by rinsing in water (>35° C.). Subsequently the flexographic printing plate precursor was developed in a drum brush washer using the commercially available developing solution Nylosolv II® (available from BASF). After development the flexographic printing plate was dried for 2 h. at 60°, irradiated with UV-C to detackify and postexposed with UV radiation for 10 min.

The flexographic printing plate thus obtained was mounted on a printing press and produced excellent prints.

Example 4

Preparation of the Imaging Material

Onto a Perlasic LF50 film (50 $\mu$m silicone treated PET film from Perlen Converting AG) a thermosensitive layer was coated and after drying for 1 h at room temperature and 1 h at 50° C. a layer having the following composition was obtained:

| Composition | Amount (g/m$^2$) | Function |
| --- | --- | --- |
| Silver behenate | 6.2 | organic silver salt |
| Polioform BR18 (Wacker Chemie) | 6.2 | polyvinyl butyral |
| Ethyl 3,4-dihydroxybenzoate | 1.0 | organic reducing agent |
| propyl gallate | 0.15 | organic reducing agent |
| benzo(e) (1,3)oxazine-2,4-dione | 0.35 | toning agent |
| Baysilone A (Bayer) | 0.024 | levelling agent |
| S1 (formula given below) | 0.14 | tone modifier |
| Tetrachloro phtalic anhydride | 0.15 | stabilizer |

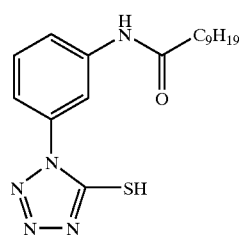

S1

Onto the thermosensitive layer an adhesive layer was coated from a solution containing the following ingredients: 1132 g Permutex PS-34-211 (pressure sensitive adhesive from Stahl Holland b.v.), 790 ml water and 80 ml of a 5% solution of CF$_3$(CF$_2$)$_7$SO$_3$[N(C$_2$H$_5$)$_4$] in water/ethanol. This solution was applied with a 10 $\mu$m coating knife and dried for 4 min. at 45° C. in a fan oven.

Lamination

First the cover film was peeled off from a Nyloflex FAR284 (available from BASF) flexographic printing plate precursor. The UV-sensitve layer of the flexographic printing plate precursor was then contacted with the adhesive layer of the imaging material and laminated in a Codor Lamipacker LPP650 at room temperature.

Thermographic Printing

After removal of the first peelable support the printing plate precursor was provided with an image in a printer equipped with a thin film thermal head with a resolution of 300 dpi that operated with a line time of 32 ms (the time line being the time needed for printing one line). During this line time the print head received constant power. The average printing power being the total amount of electrical input energy during one line time divided by the line time and by the surface area of the heat-generating resistors was 1.86 mJ/dot being sufficient to obtain maximum optical density in the thermographic material. In order to avoid direct contact of the thermal print head with the imaging layer, which is not provided with a thin outermost protective layer, a 5 $\mu$m thick resin sheet or web was positioned between the thermal head and the imaging layer.

Preparation of the Flexographic Printing Plate

After image-wise exposure the flexographic printing plate precursor was flood exposed through the mask with UV radiation (4000 $\mu$W/cm$^2$) for 15 min. followed by an exposure through the opposite site for 10 min. Thereafter the flexographic printing plate precursor was developed in a drum brush washer using the commercially available developing solution Nylosolv II® (available from BASF). After development the flexographic printing plate was dried for 2 h. at 60°, irradiated with UV-C to detackify and postexposed with UV radiation for 10 min.

The flexographic printing plate thus obtained was mounted on a printing press and produced excellent prints.

We claim as our invention:

1. Method for preparation of a relief image comprising the following steps:
   (a) laminating a material consisting essentially of, in the order given, a first peelable support, an optional release layer, an image recording layer and an adhesive layer onto a UV-sensitive material comprising a support and a UV-sensitive layer, wherein the adhesive layer is laminated to the UV-sensitive layer;
   (b) image-wise exposing the image recording layer to form a mask;
   (c) flood exposing the UV-sensitive material through the mask;
   (d) developing the UV-sensitive material;
   wherein the peelable support is removed either before step (b), (c) or (d) and wherein steps (a) and (b) are performed on-site within a period of less than 2 months.

2. Method according to claim 1 wherein the UV-sensitive material further comprises an additional layer on top of the UV-sensitive layer and wherein the adhesive is laminated on top of the additional layer.

3. Method according to claim 1 wherein the image recording layer is a laser ablatable layer comprising a heat combustible polymeric binder and a light absorbing compound.

4. Method according to claim 1 wherein the image recording layer is a thin metallic layer.

5. Method according to claim 1 wherein the image recording layer is an ink jet receiving layer.

6. Method according to claim 1 wherein the image recording layer is a thermographic recording layer.

7. Method according to claim 1 wherein the image recording layer is a photothermographic recording layer.

8. Method according to claim 1 wherein the first peelable support is a plastic film coated with a release agent on the side facing the image recording layer.

9. Method according to claim 1 wherein said adhesive layer is a thermosensitive adhesive layer.

10. Method according to claim 1 wherein said adhesive layer is a pressure-sensitive adhesive layer.

11. Method according to claim 10 wherein said pressure-sensitive adhesive layer is covered by a second peelable support which is removed before step (a).

12. Method according to claim 11 wherein the second peelable support is a plastic film coated with a release agent on the side facing the pressure-sensitive adhesive layer.

13. Method according to claim 8 wherein the release agent is a silicone.

14. Method according to claim 1 wherein said UV-sensitive material is a photoresist material.

15. Method according to claim 1 wherein said UV-sensitive material is a lithographic printing plate precursor.

16. Method according to claim 1 wherein said UV-sensitive material is a flexographic printing plate precursor.

17. Method according to claim 1 wherein the mask is removed by the developing step (d).

18. Method according to claim 1 wherein the mask is removed by an additional developing step between step (c) and step (d).

19. Method according to claim 1 wherein the mask is removed by peel-off before developing step (d).

* * * * *